United States Patent
Lee et al.

(10) Patent No.: US 6,686,120 B2
(45) Date of Patent: Feb. 3, 2004

(54) PHOTORESIST COMPOSITION AND METHOD OF FORMING PATTERN USING THE SAME

(75) Inventors: You-Kyoung Lee, Suwon-si (KR); Sung-Chul Kang, Yongin-si (KR); Jin-Ho Ju, Seoul (KR); Dong-Ki Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/219,711

(22) Filed: Aug. 15, 2002

(65) Prior Publication Data

US 2003/0134222 A1 Jul. 17, 2003

(30) Foreign Application Priority Data

Jan. 9, 2002 (KR) .......................................... 2002-1138

(51) Int. Cl.[7] .............................. G03F 7/023; G03F 7/30
(52) U.S. Cl. ...................... 430/191; 430/165; 430/192; 430/193; 430/326; 430/330
(58) Field of Search ................................ 430/191, 192, 430/193, 165, 326, 330

(56) References Cited

U.S. PATENT DOCUMENTS

| | | | | |
|---|---|---|---|---|
| 3,900,325 A | * | 8/1975 | Christensen et al. | 430/191 |
| 5,624,781 A | * | 4/1997 | Naruse et al. | 430/192 |
| 5,650,261 A | * | 7/1997 | Winkle | 430/270.1 |
| 5,942,369 A | * | 8/1999 | Ota et al. | 430/192 |

* cited by examiner

Primary Examiner—John S. Chu
(74) Attorney, Agent, or Firm—F. Chau & Associates, LLP

(57) ABSTRACT

Disclosed is a photoresist composition including a thermal acid generator and a method of forming a pattern using the same. The photoresist composition includes about 100 parts by weight of an alkali-soluble acryl copolymer, about 5–100 parts by weight of 1,2-quinonediazide compound, about 2–35 parts by weight of nitrogen-containing cross-linking agent and about 0.1–10 parts by weight of a thermal acid generator which produces an acid by heat. The photoresist composition is coated on a substrate and dried to form a photoresist layer. The photoresist layer is exposed by using a mask having a predetermined shape. Thus obtained exposed photoresist layer is developed by using an aqueous alkaline solution to form a photoresist pattern. Thus obtained photoresist pattern is heated to be cured without generating thermal reflow.

20 Claims, 6 Drawing Sheets

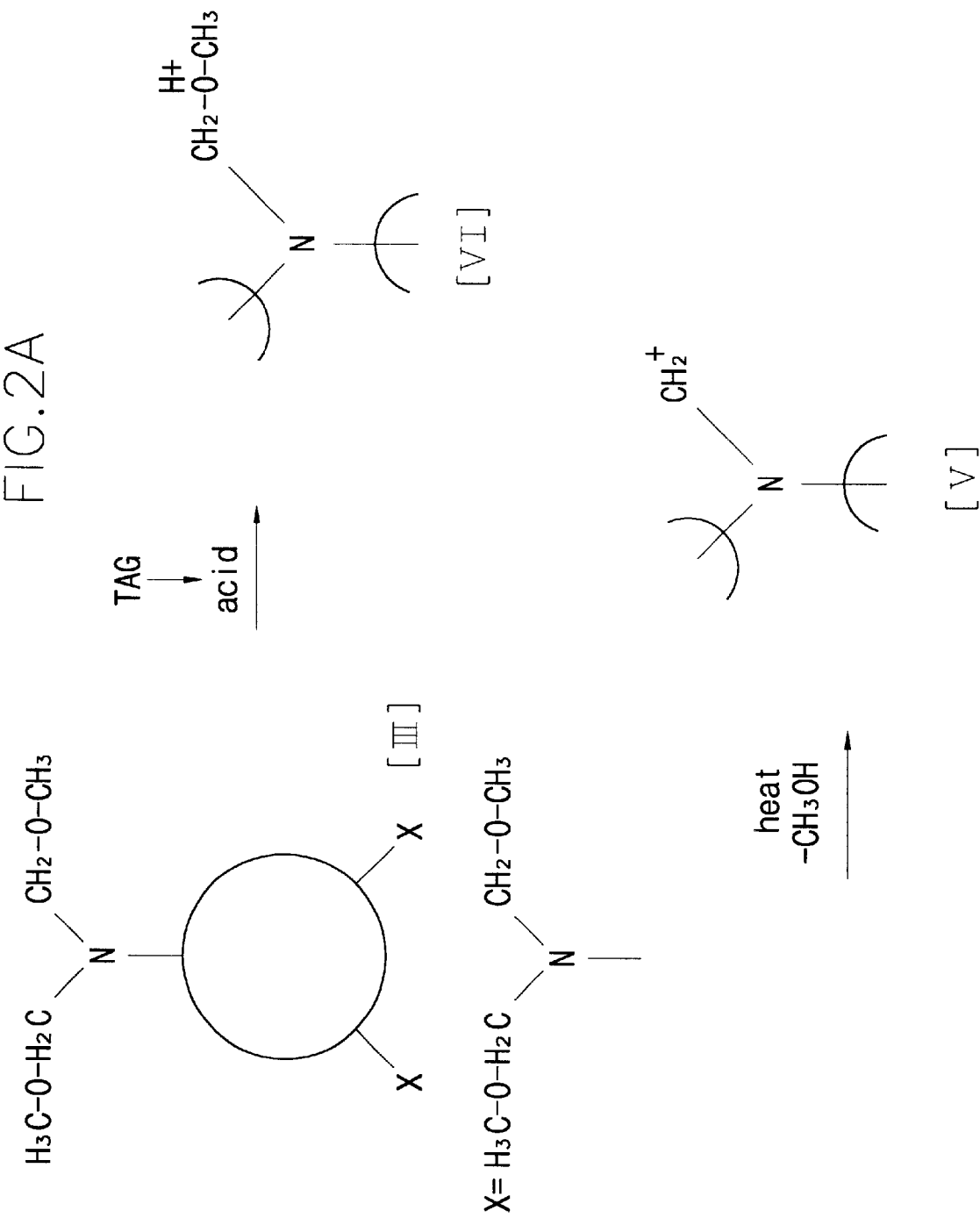

PHOTORESIST COMPOSITION AND METHOD OF FORMING PATTERN USING THE SAME

BACKGROUND OF THE INVENTION

1. Field of the Invention

The present invention relates to a photoresist composition and a method of forming a pattern using the same, and more particularly, to a photoresist composition having a thermal curing agent and a method of forming a pattern using the same.

2. Description of the Related Arts

Flat panel display devices have become increasingly popular because they are thin, light, and have a low power consumption characteristic.

Among flat panel devices, liquid crystal display (LCD) devices have been widely utilized because in addition to the above advantages LCD devices are capable of displaying a high quality image. LCD devices are widely used as computer monitors and more recently as television units.

As LCD devices become larger, manufacturing becomes more complex. One reason is because the need for an enlarged glass, and the need to use photoresist composition satisfying new process conditions, such as processes for fabricating the fine featured patterns of circuits.

LCD devices are generally classified into reflection type and transmission type. The power consumption of the reflection type LCD device is lower than that of the transmission type LCD device and an image displaying quality of the reflection type LCD device at the outdoor is better than that of the transmission type LCD device. In addition, a separate light source such as a back light assembly is not required for the reflection type LCD device.

Because there is no backlight assembly, the display image of the reflection type LCD device is not bright and a correspondent minute display and color display are also not sufficient bright. Accordingly, the use of the reflection type LCD device is limited for displaying numerals and simple characters. If reflection type LCD devices are to be used for various electronic display devices, the reflection efficiency, and the brightness of the minuteness and coloring need to be improved.

For the reflection type LCD device, the brightness is improved by combining two techniques of increasing a reflecting efficiency of a reflecting electrode and a fine aperture efficiency. U.S. Pat. No. 5,610,741 issued to Naofumi Kimura discloses and proposes a method of improving reflecting efficiency by forming minute irregularities on the reflecting electrode.

An important point for the manufacture of the minute irregularities is the formation of an embossing pattern by using an organic insulating layer. The shape of the embossing pattern is dependent on a curing temperature thereof as well as a characteristic of a pattern forming material. Accordingly, when the reflowing characteristic of the embossing pattern can be controlled according to the temperature, a desired pattern can be obtained.

An embossing pattern is generally formed by a method described below. First, a photoresist composition is coated on a substrate by a common coating method such as dipping, spraying, rotating, and spin coating to form a photoresist layer.

The coated photoresist layer is heated to about 80–130° C. (soft bake) to evaporate the solvent. The formed photoresist layer is selectively exposed to light such as ultraviolet by using a mask to form an exposed portion, wherein the photoresist layer becomes an alkali-soluble resin and dissolves into a developing solution during a subsequently implemented developing process. The exposed layer is dipped into the aqueous alkaline developing solution and is stood still until almost the exposed portion of the photoresist layer is dissolved. As for the developing solution, an aqueous solution including alkaline hydroxide, ammonium hydroxide, tetramethyl ammonium hydroxide, and the like can be used.

After completing the dissolution of the exposed portion, the substrate is taken out of the developing solution. Then, a heat treatment is performed to increase an adhesiveness and a chemical-resistance of the photoresist layer. This process is called a hard bake process. This heat treatment is performed at a temperature range of about 100–250° C. Through a completion of the heat treatment, an embossing pattern having a desired shape can be obtained.

On the embossing pattern, a reflecting layer is formed by a vacuum deposition process using aluminum, nickel, etc. Then, the reflecting layer is formed to have irregularities along the shape of the underlying embossing pattern to increase the reflecting efficiency of the reflecting layer.

However, the organic insulating layer of the embossing pattern reflows during performing a thermal curing process such as a heat treatment at a high temperature and the shape formed after the development process is not kept and most of the irregularities of the embossing pattern are eliminated.

FIGS. 1A and 1B are cross-sectional views for the pattern obtained after development (FIG. 1A) and after thermal curing (FIG. 1B) when an embossing pattern is formed by using a conventional photoresist composition. On a substrate 10, a pattern 12 (in FIG. 1A) obtained after development and a pattern 12a (in FIG. 1B) after curing are illustrated. The curing was implemented at about 110° C. for about 2 minutes and then at about 220° C. for about 30 minutes. The pattern 12a after performing the curing process almost disappears due to flowing of the pattern by the applied heat. That is, the shape of the embossing pattern is not properly maintained. Accordingly, it would be highly desirable to develop a photoresist composition for forming a pattern of an organic insulating layer of which flowing can be restrained during implementing a thermal curing process and to provide a method of a patterning having a good profile after performing a thermal curing process.

SUMMARY OF THE INVENTION

A photoresist composition is provided, which includes about 100 parts by weight of an alkali-soluble acryl copolymer, about 5–100 parts by weight of 1,2-quinonediazide compound, about 2–35 parts by weight of nitrogen-containing cross-linker, and about 0.1–10 parts by weight of a thermal acid generator which produces an acid by heat.

According to an embodiment of the present invention, the alkali-soluble acryl copolymer has a weight-average molecular weight (Mw) in a range of about $5 \times 10^3 – 3 \times 10^4$ as converted to polystyrene. The alkali-soluble acryl copolymer is prepared by copolymerizing about 5–40% by weight of unsaturated carbonic acid, unsaturated carbonic acid anhydride or a mixture thereof, about 10–70% by weight of an epoxy-functional group containing unsaturated compound, and about 10–70% by weight of unsaturated olefin compound in a solvent having an polymerization initiator. The unsaturated carbonic acid is selected from the group consisting of acrylic acid, methacrylic acid, maleic acid anhydride, and their mixtures. The epoxy-functional group containing unsaturated compound is selected from the group consisting of glycidyl acrylate, glycidyl methacrylate, α-ethylglycidyl acrylate, α-n-propylglycidyl acrylate, α-n-butylglycidyl acrylate, acrylic acid-β-methyl glycidyl, methacrylic acid-β-methyl glycidyl, acrylic acid-β-ethyl glycidyl, methacrylic acid-β-ethyl glycidyl, acrylic acid-3,4-epoxybutyl, methacrylic acid-3,4-epoxybutyl, acrylic acid-6,7-epoxy heptyl, methacrylic acid-6,7-epoxy heptyl, α-ethyl acrylic acid-6,7-epoxy heptyl, o-vinylbenzyl glycidyl ether, m-vinyl benzylglycidyl ether, p-vinylbenzyl glycidyl ether, and their mixtures. The unsaturated olefin compound is selected from the group consisting of benzyl methacrylate, methyl methacrylate, ethyl methacrylate, n-butyl methacrylate, sec-butyl methacrylate, t-butyl methacrylate, methyl acrylate, isopropyl acrylate, cyclohexyl methacrylate, 2-methyl cyclohexyl methacrylate, dicyclopentanyl oxyethyl methacrylate, isobornyl methacrylate, cyclohexyl acrylate, 2-methyl cyclohexyl acrylate, dicyclopentanyl oxyethyl acrylate, isovornyl acrylate, phenyl methacrylate, phenyl acrylate, benzyl acrylate, 2-hydroxyethyl methacrylate, styrene, α-methyl styrene, m-methyl styrene, p-methyl styrene, vinyl toluene, p-methoxy styrene, 1,3-butadiene, isoprene, 2,3-dimethyl 1,3-budadiene, and their mixtures.

According to an embodiment of the present invention, the 1,2-quinonediazide compound is prepared by reacting a naphtoquinonediazide sulfonic acid halogen compound with a phenol compound under a presence of a base. The phenol compound is selected from the group consisting of 2,3,4-trihydroxy benzophenone, 2,4,6-trihydroxy benzophenone, 2,2',4,4'-tetrahydroxy benzophenone, 2,3,4,3'-tetrahydroxy benzophenone, 2,3,4,4'-tetrahydroxy benzophenone, 2,3,4,2'-tetrahydroxy 4'-methyl benzophenone, 2,3,4,4'-tetrahydroxy 3'-methoxy benzophenone, 2,3,4,2'6'-pentahydroxy benzophenone, 2,4,6,3',4',5'-hexahydroxy benzophenone, 3,4,5,3',4',5'-hexahydroxy benzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris (2,5-dimethyl 4-hydroxyphenyl)-3-phenyl propane, 4,4'-[1-[4-[1-[4-hydroxyphenyl]-1-methylethyl]phenyl]ethylidene] bisphenol, bis(2,5-dimethyl 4-hydroxyphenyl)-2-hydroxyphenylmethane, and their mixtures. An esterification degree of the reaction between said naphthoquinonediazide sulfonic acid halogen compound and said phenol compound is in a range of about 50–85%.

According to an embodiment of the present invention, the 1,2-quinonediazide compound is at least one selected from the group consisting of 1,2-quinonediazide 4-sulfonic acid ester, 1,2-quinonediazide 5-sulfonic acid ester, and 1,2-quinonediazide 6-sulfonic acid ester. The nitrogen-containing cross-linking agent is at least one selected from the group consisting of methylol urea alkyl ether prepared by reacting a condensing product of urea and formaldehyde with alcohol, and methylol melamine alkyl ethers prepared by reacting a condensing product of melamine and formaldehyde with alcohol. The methylol urea alkyl ethers includes mono methyl urea methyl ether and dimethyl urea methyl ether, and the methylol melamine alkyl ethers includes hexamethylol melamine hexamethyl ether and hexamethylol melamine hexabutyl ether. The thermal acid generator includes a sulfonic ester compound.

The sulfonic ester compound is represented the following structure:

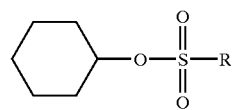

wherein R represents alkyl group. The sulfonic ester compound includes cyclohexane toluene sulfonic ester having a structure (1), cyclohexane propyl sulfonic ester having a structure (2), cyclohexane methyl sulfonic ester having a structure (3), cyclohexane octyl sulfonic ester having a structure (4), and cyclohexane camphor sulfonic ester having a structure (5)

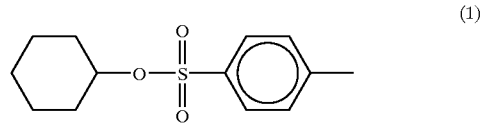 (1)

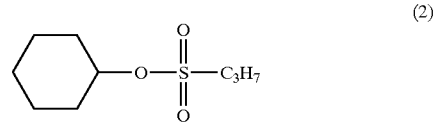 (2)

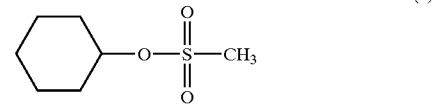 (3)

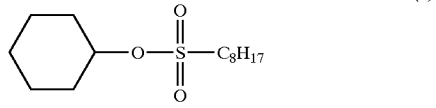 (4)

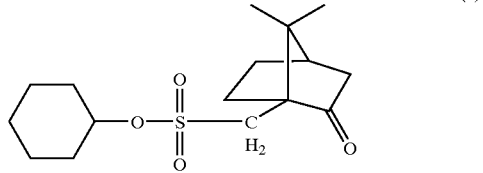 (5)

The thermal acid generator is at least one selected from the group consisting of cyclohexanetoluene sulfonic ester, cyclohexanepropyl sulfonic ester, cyclohexanemethyl sulfonic ester, cyclohexaneoctyl sulfonic ester, and cyclohexanecamphor sulfonic ester. The thermal acid generator further includes about 50 parts by weight or less of a synthesizable compound having an unsaturated double bond based on 100 parts by weight of said alkali-soluble acryl copolymer, about 2 parts by weight or less of a surfactant based on 100 parts by weight of a solid content of said photoresist composition, and an adhesive. A solid concentration of said photoresist composition is in a range of about 30–70%.

A method of forming a pattern is provided, which includes the steps of: coating a photoresist composition on a substrate and drying to form a photoresist layer; exposing said photoresist layer by using a mask having a predetermined shape; developing the exposed photoresist layer by using an aqueous alkaline solution to form a photoresist pattern; and heating the photoresist pattern to cure thereof, wherein the photoresist composition comprises about 100 parts by weight of an alkali-soluble acryl copolymer, about 5–100 parts by weight of 1,2-quinonediazide compound, about 2–35 parts by weight of nitrogen-containing cross-linker and about 0.1–10 parts by weight of a thermal acid generator which produces an, acid by heat.

According to an embodiment of the present invention, the step of heating the photoresist pattern is performed at a temperature range of about 100° C. to about 250° C. The photoresist pattern is an embossing pattern of a liquid crystal display device.

BRIEF DESCRIPTION OF THE DRAWINGS

The above and other objects and advantages of the present invention will become readily apparent by reference to the following detailed description when considered in conjunction with the accompanying drawings wherein:

FIGS. 2A and 2B illustrate reaction mechanisms of a thermal acid generator during a thermal curing process for the photoresist composition of the present invention;

DETAILED DESCRIPTION OF THE INVENTION

Figure 1A:
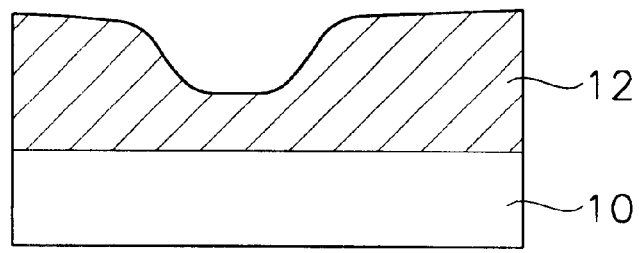
FIGS. 1A and 1B are cross-sectional views for the patterns obtained after development (FIG. 1A) and after thermal curing (FIG. 1B) when an embossing pattern is formed by using a conventional photoresist composition.

Hereinafter, the present invention will be described in detail below.

The present invention provides a positive type photoresist composition used for manufacturing liquid crystal display devices and semiconductor devices. According to an embodiment of the present invention, the photoresist composition includes an alkali-soluble acryl copolymer, a 1,2-quinonediazide compound, and a thermal acid generator.

According to an embodiment of the present invention, the alkali-soluble acryl copolymer is prepared by reacting unsaturated carbonic acid and/or unsaturated carbonic acid anhydride (a1), an epoxy-functional group containing unsaturated compound (a2), and an unsaturated olefin compound (a3) in a solvent having a polymerizing initiator.

It is preferred that the alkali-soluble acryl copolymer has a weight-average molecular weight (Mw) in a range of about $5 \times 10^3$ to about $3 \times 10^4$ as converted to polystyrene. When the Mw is less than about $5 \times 10^3$, a developing characteristic and a residual layer characteristic is lowered and a pattern shape and a heat-resistance, etc. are deteriorated. When the Mw exceeds about $3 \times 10^4$, the sensitivity is lowered and a pattern shape is deteriorated.

The unsaturated carbonic acid and/or unsaturated carbonic acid anhydride (a1) includes unsaturated mono-carbonic acid such as acrylic acid, methacrylic acid, etc., unsaturated di-carbonic acid such as maleic acid, furmaric acid, citric acid, meitaconic acid, itaconic acid, etc., and unsaturated di-carbonic acid anhydride thereof. Preferably, acrylic acid, methacrylic acid, maleic acid anhydride, and their mixtures are used when considering copolymerizing characteristic and dissolubility into an aqueous alkaline solution.

According to an embodiment of the present invention, preferred amount of unsaturated carbonic acid and/or unsaturated carbonic acid anhydride (a1) is in a range of about 5% to about 40% by weight. When the amount of this compound a1 is less than about 5% by weight, the obtained copolymer is hard to be dissolved into an aqueous alkaline solution. When the amount of this compound a1 exceeds about 40% by weight, the dissolubility of the obtained copolymer is excessively great. Preferably, the amount of unsaturated carbonic acid and/or unsaturated carbonic acid anhydride (a1) is within the range of about 10% and to 30% by weight.

According to an embodiment of the present invention, the epoxy-functional group containing compound (a2) is selected from the group consisting of glycidyl acrylate, glycidylmethacrylate, α-ethylglycidyl acrylate, α-n-propylglycidyl acrylate, α-n-butylglycidyl acrylate, acrylic acid-methyl glyci acrylic acid-β-ethyl glycidyl, methacrylic acid-β-ethyl glycidyl, acrylic acid-3,4-epoxybutyl methacrylic acid-3,4-epoxybutyl, acrylic acid-6,7-epoxy heptyl, methacrylic acid-6,7-epoxy heptyl, α-ethyl acrylic acid-6,7-epoxy heptyl, o-vinylbenzyl glycidyl ether, m-vinyl benzylglycidyl ether, p-vinylbenzyl glycidyl ether, and their mixtures.

Preferably, glycidyl methacry late, methacrylic acid-β-methyl glycidyl, methacrylic acid-6,7-epoxy heptyl, o-vinylbenzyl glycidyl ether, m-vinylbenzyl glycidyl ether, p-vinylbenzyl glycidyl ether, and their mixtures are used when considering the polymerization degree and the heat-resistance of the formed pattern.

The preferred amount of the epoxy-functional group containing unsaturated compound (a2) is in a range of about 10% to about 70% by weight. When the amount of this compound a2 is less than about 10% by weight, the heat-resistance of the formed pattern is deteriorated. When the amount of the compound a2 exceeds about 70% by weight, the storing stability of the prepared copolymer is lowered. More preferably, the amount of the compound a2 is in a range of about 20% to about 60% by weight.

According to an embodiment of the present invention, the unsaturated olefin compound a3 is selected from the group consisting of benzyl methacrylate, methyl methacrylate, ethyl methacrylate, n-butyl methacrylate, sec-butyl methacrylate, t-butyl methacrylate, methyl acrylate, isopropyl acrylate, cyclohexyl methacrylate, 2-methyl cyclohexyl methacrylate, dicyclopentanyl oxyethyl methacrylate, isobornyl methacrylate, cyclohexyl acrylate, 2-methyl cyclohexyl acrylate, dicyclopentanyl oxyethyl acrylate, isovornyl acrylate, phenyl methacrylate, phenyl acrylate, benzyl acrylate, 2-hydroxyethyl methacrylate, styrene, α-methyl styrene, m-methyl styrene, p-methyl styrene, vinyl toluene, p-methoxy styrene, 1,3-butadiene, isoprene, 2,3-dimethyl 1,3-budadiene, and their mixtures.

Preferably, benzyl methacrylate, styrene, dicyclopentanyl methacrylate, p-methoxy styrene, and their mixtures are preferred used when considering the polymerization degree and dissolving power into an aqueous alkaline solution.

The preferred amount of the unsaturated olefin compound a3 is in a range of about 10% to about 70% by weight, When the amount of this compound a3 is less than about 10% by weight, a storing stability of the prepared copolymer is lowered. When the amount of this compound exceeds about 70% by weight, the prepared copolymer is hard to be dissolved into an aqueous alkaline solution. More preferably, the amount of this compound a3 is in a range of about 20% to about 50% by weight.

According to an embodiment of the present invention, the solvent is selected from the group consisting of methanol, tetrahydrofurane, ethyleneglycol monomethyl ether, ethyleneglycol monoethyl ether, methylcellosolve acetate, ethylcellosolve acetate, diethyleneglycol monomethyl ether, diethyleneglycol monoethyl ether, ethyleneglycol dimethyl ether, etyleneglycol diethyl ether, ethyleneglycol methylethyl ether, propyleneglycol monoethyl ether, propyleneglycol monoethyl ether, propyleneglycol propyl ether, propyleneglycol butyl ether, propyleneglycol methyl ether acetate, propyleneglycol ethyl ether acetate, propyleneglycol propyl ether acetate, propyleneglycol butyl ether acetate, propyleneglycol methylethyl propionate, propyleneglycol ethyl ether propionate, propyleneglycol propyl ether propionate, propyleneglycol butyl ether propionate, toluene, xylene, methyl ethyl ketone, cyclohexanone, 4-hydroxy 4-methyl 2-pentanone, methyl acetate, ethyl acetate, propyl acetate, butyl acetate, ethyl 2-hydroxypropionate, methyl 2-hydroxy 2-methylpropionate, ethyl 2-hydroxy 2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy 3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, and their mixtures.

According to an embodiment of the present invention, the polymerizing initiator is selected from the group consisting of 2,2'-azo-bisisobutyl nitrile, 2,2'-azo-bis(2,4-dimethyl barello nitrile), 2,2'-azo-bis(4-methoxy 2,4-dimethyl barello nitrile), 1,1'-azo-biscyclohexane-1-carbonitrile, and dimethyl 2,2'-azo-bisisobutylrate.

According to an embodiment of the present invention, the 1,2-quinonediazide compound is selected from the group consisting of 1,2-quinonediazide-4-sulfonic acid ester, 1,2-quinonediazide 5-sulfonic acid ester, and 1,2-quinonediazide 6-sulfonic acid ester, and their mixtures. The quinonediazide compound can be prepared by reacting naphtoquinonediazide sulfonic acid halogen compound with phenol compound in the presence of a weak base.

The phenol compound is selected from the group consisting of 2,3,4-trihydroxy benzophenone, 2,4,6-trihydroxy benzophenone, 2,2',4,4'-tetrahydroxy benzophenone, 2,3,4,3'-tetrahydroxy benzophenone, 2,3,4,4'-tetrahydroxy benzophenone, 2,3,4,2'-tetrahydroxy 4'-methyl benzophenone, 2,3,4,4'-tetrahydroxy 3'-methoxy benzophenone, 2,3,4,2'6'-pentahydroxy benzophenone, 2,4,6,3',4',5'-hexahydroxy benzophenone, 3,4,5,3',4',5'-hexahydroxy benzophenone, bis(2,4-dihydroxyphenyl) methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl 4-hydroxyphenyl)-3-phenyl propane, 4,4'-[1-[4-[1-[4-hydroxyphenyl]-1-methylethyl]phenyl]ethylidene] bisphenol, bis(2,5-dimethyl 4-hydroxyphenyl)-2-hydroxyphenylmethane, and their mixtures.

For the synthesis of the quinonediazide compound, the preferred esterification degree is in a range of about 50% to about 85%. When the esterification degree is less than about 50%, a residual layer characteristic is deteriorated and when the esterification degree exceeds about 85%, a storing stability of the product is lowered.

The preferred amount of the 1,2-quinonediazide compound is in a range of about 5–100 parts by weight based on 100 parts by weight of the copolymer. When the amount of this compound is less than about 5 parts by weight, solubility difference between an exposed portion and non-exposed portion of a photoresist layer becomes small and so the formation of a photoresist pattern is difficult. When the amount of this compound exceeds about 100 parts by weight, a large amount of un-reacted 1,2-quinonediazide compound remains when exposed to a light source for a short time being. At this time, the solubility of the exposed portion into an aqueous alkaline solution is too low and a development is not accomplished. More preferably, the amount of this compound is in a range of about 10–50 parts by weight based on 100 parts by weight of the copolymer.

According to an embodiment of the present invention, the thermal acid generator produces an acid by heat to promote a polymerization under an acid catalyst. The preferred thermal acid generator includes sulfonic ester compounds represented by the following structure can be used. In this structure, R represents alkyl group.

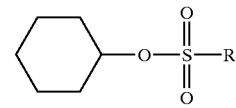

Preferably, the sulfonic ester compounds include cyclohexane toluene sulfonic ester (1), cyclohexane propyl sulfonic ester (2), cyclohexane methyl sulfonic ester (3), cyclohexane octyl sulfonic ester (4), and cyclohexane camphor sulfonic ester (5). The structures of these compounds are shown below. Among them, More preferably, cyclohexane toluene sulfonic ester (1) and cyclohexane propyl sulfonic ester (2) are used.

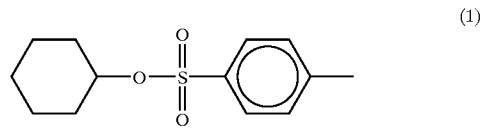

(1)

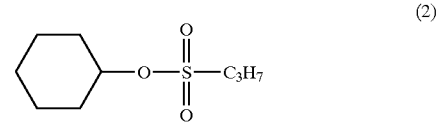

(2)

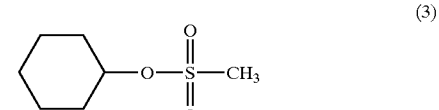

(3)

-continued

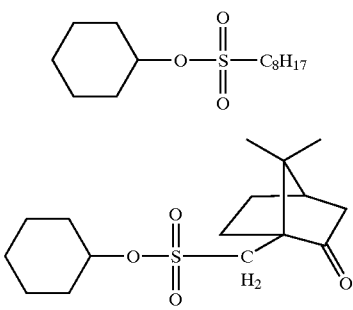

The amount of the thermal acid generator is in a range of about 0.1–10 parts by weight based on 100 parts by weight of the copolymer. When the amount is less than about 0.1 parts by weight, the addition effect of the thermal acid generator cannot be obtained. When the amount exceeds about 10 parts by weight, the control of flowing characteristic is difficult and an adhesiveness is deteriorated. More preferably, the amount of the thermal acid generator is in a range of about 0.5–5 parts by weight.

According to an embodiment of the present invention, the photoresist composition further includes a nitrogen-containing cross-linking agent. The nitrogen-containing cross-linking agent forms a cross-linked structure with the alkali-soluble acryl copolymer. The nitrogen-containing cross-linking agent includes methylol urea alkyl ether and methylol melamine alkyl ether. The methylol urea alkyl ether is prepared by reacting a condensing product of urea and formaldehyde with an alcohol, and the methylol melamine alkyl ether is prepared by reacting a condensing product of melamine and formaldehyde with an alcohol, etc.

The condensing product of urea and formaldehyde includes monomethylol urea and dimethylol urea. The condensing product of melamine and formaldehyde includes hexamethylol melamineand a partially condensing product of melamine and formaldehyde.

The methylol urea alkyl ether includes monomethyl urea methyl ether and dimethyl urea methyl ether prepared by reacting a partial or whole of the methylol functional group of a urea-formaldehyde condensate with alcohol.

The methylol melamine alkyl ether includes hexamethylol melamine hexamethyl ether and hexamethylol melamine hexabutyl ether prepared by reacting a partial or whole of the methylol functional group of a melamine-formaldehyde condensate with alcohol. Besides, melamine compounds of which hydrogen atom in amino functional group is replaced with hydroxy methyl group or methoxy methyl group, melamine compounds of which hydrogen atom in amino functional group is replaced with butoxy methyl group or methoxy methyl group also can be used. More preferably, methylol melamine alkyl ether is used. As for commercially available kinds, Cymel-300, Cymel-303 (trade name; both are available from Cytec Industries INC. Japan), Nikalac Mw-30, Mw-100LM, Mw-750LM, Mx-290, Mx-280, N2702 (trade name; available from Sanwa Chemical Co. Japan), etc. can be illustrated.

The preferred amount of the nitrogen-containing cross-linking agent is in a range of about 2–35 parts by weight based on 100 parts by weight of the copolymer. When the amount of this compound is less than about 2 parts by weight, a sufficient cross-linking structure cannot be obtained. When the amount of this compound exceeds about 35 parts by weight, the thickness of the non-exposed portion of the photoresist layer is largely reduced and a transparency is deteriorated. More preferably, the amount of this compound is in a range of about 5–25 parts by weight based on 100 parts by weight of the copolymer.

According to an embodiment of the present invention, the thermal acid generator functions to promote a curing reaction of the photoresist layer through generating an acid during a heat treatment.

This function will be described in more detail with reference to the attached drawings.

Figure 2B:
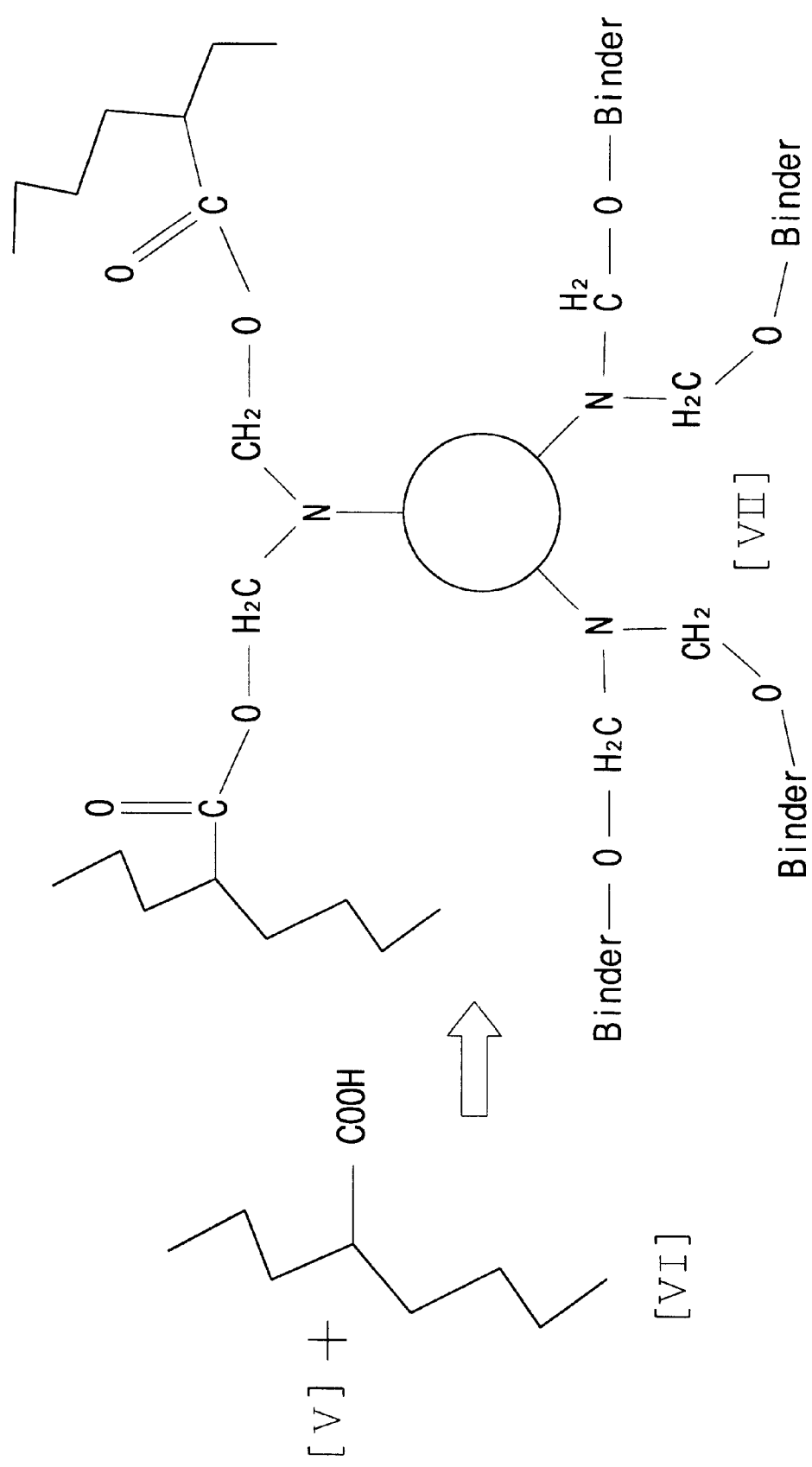

FIGS. 2A & 2B illustrate reaction mechanisms of a thermal acid generator during a thermal curing process for the photoresist composition of the present invention.

Referring to FIG. 2A, during a heat treatment for performing a hard bake process after completing a developing process, the thermal acid generator (TAG) produces an acid. This acid is combined with nitrogen-containing cross linking agent such as a melamine cross linking agent (III) to produce a compound (IV). By applying heat, alcohol is separated from the compound (IV) to produce an active compound represented by (V).

Referring to FIG. 2B, a carboxyl group in the photoresist composition is combined with an active site of the produced compound (V) to produce a cured compound of (VI). The photoresist compostion is completely cured through the formation of this compound (VI).

The positive-type photoresist composition of the present invention can further include a synthesizable compound having an unsaturated double bond, a surfactant, and an adhesive.

The synthesizable compound having an unsaturated double bond is selected from the group consisting of mono-functional methacrylate, bi-functional methacrylate, tri- or more-functional methacrylate, and their mixtures.

The mono-functional methacrylate is preferably selected from the group consisting of 2-hydroxyethyl methacrylate, isobornyl methacrylate, 3-methoxybutyl methacrylate, and 2-methacryloyl oxyethyl 2-hydroxypropyl phthalate. The bi-functional methacrylate is preferably selected from the group consisting of ethyleneglycol methacrylate, 1,6-hexanediol dimethacrylate, 1,9-nonandiol methacrylate, propyleneglycol methacrylate, tetraethyleneglycol methacrylate, bisphenoxyethanol fluoro diacrylate, and their mixtures. The tri- or more-functional methacrylate is preferably selected from the group consisting of trimethylpropane trimethacrylate, pentaerythritol trimethacrylate, tri ((meta)acryloyl oxyethyl)phosphate, pentaerythritol tetramethacrylate, dipentaerythritol pentamethacrylate, dipentaerythritol hexamethacrylate, and their mixtures. Commercially available examples are Aronix M-210, M-240, M-6200 (trade name; available from Toagosei Co., Ltd. Japan), KAYARAD HDDA, HX-220, TMPTA, DPHA, DPCA-20 (trade name; available from NIPPON KAYAKU CO.,LTD.), Viscoat 260, 312, 295, 300 (trade name; available from Osaka Organic Chemical Industry Co., Ltd.), etc.

By including the synthesizable compound having an unsaturated double bond in the positive-type photoresist composition of the present invention, a heat-resistance, a sensitivity of the pattern can be improved by cross-linking of those composition. The preferred amount of this synthesizable compound is in a range of about 50 parts by weight or less based on 100 parts by weight of the copolymer. More preferably, about 30 parts by weight or less of the synthesizable compound is used.

According to an embodiment of the present invention, a surfactant is further included in the photoresist composition to increase a coating characteristic and a developing characteristic. As for the surfactant, polyoxyethylene octylphenyl ether, polyoxyethylene nonylphenyl ether, F171, F172, F173 (trade names; available from Dai Nippon Ink Co., Ltd.), FC430, FC431 (trade names; available from Sumitomo3m Co., Ltd.), KP341 (trade name; available from Shin-etsu Chemical Co., Ltd. Japan), etc. can be used. The preferred amount of the surfactant is in a range of about 2 parts by weight or less based on 100 parts by weight of the solid content.

According to an embodiment of the present invention, a silane coupling agent including a reactive substitute such as carboxy group, methacryl group, isocyanate group, and epoxy group is further.included in the photoresist composition for improving an adhesion onto the substrate. Preferably, the silane coupling agent is selected from the group consisting of trimethoxy silyl benzoic acid, γ-methacryl propyl trimethoxy silane, vinyltriacetoxy silane, vinyl trimethoxy silane, γ-isocyanate propyl triethoxy silane, γ-glycidoxy propyl trimethoxy silane, and β-(3,4-epoxy cyclohexyl)ethyl trimethoxy silane.

According to an embodiment of the present invention, the solvent used for the preparation of the photoresist composition of the present invention is selected from the group consisting of alcohols such as methanol and ethanol, ethers such as tetrahydrofurane, glycol ethers such as ethyleneglycol monomethyl ether and ethyleneglycol monoethyl ether, ethyleneglycol alkyl ether acetates such as methyl cellosolve acetate and ethyl cellosolve acetate, diethyleneglycols such as diethyleneglycoi monomethyl ether, diethyleneglycol monoethyl ether and diethyleneglycol dimethyl ether, propyleneglycol monoalkyl ethers such as propyleneglycol methyl ether, propyleneglycol ethyl ether, propyleneglycol propyl ether and propyleneglycol butyl ether, propyleneglycol alkyl ether acetates such as propyleneglycol methyl ether acetate, propyleneglycol ethyl ether acetate, propyleneglycol propyl ether acetate and propyleneglycol butyl ether acetate, propyleneglycol alkyl ether propionates such as propyleneglycol methyl ether propionate, propyleneglycol ethyl ether propionate, propyleneglycol propyl ether propionate and propyleneglycol butyl ether propionate, aromatic compound such as toluene and xylene, ketone such as methyl ethyl ketone, cyclohexanone and 4-hydroxy 4-methyl 2-pentanone, and ester compound such as methyl acetate, ethyl acetate, propyl acetate, butyl acetate, ethyl 2-hydroxypropionate, methyl 2-hydroxy 2-methyl propionate, ethyl 2-hydroxy 2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy 3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc.

Preferably, glycol ethers, ethyleneglycol alkyl ether acetates, and diethyleneglycols are used when considering a reactivity of the components composing the photoresist composition and a manufacturing condition of a coating layer.

The preferred solid content of the photoresist composition including various components is preferably in a range of about 30–70% by weight. In particular, the photoresist composition is used after filtering by means of a millipore filter of about 0.2 μm.

A method of forming a pattern using the photoresist composition of the present invention will be described in detail with reference to the attached drawings.

Figure 3A:
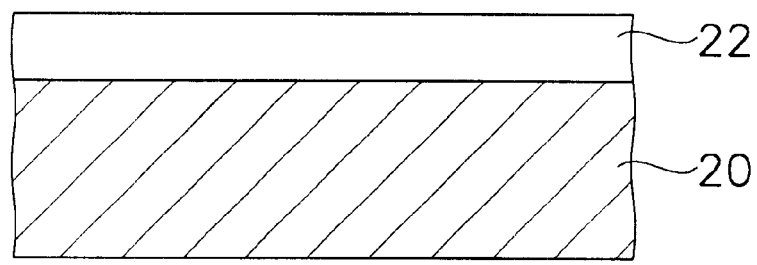
FIGS. 3A–3C are schematic cross-sectional views illustrating a method of forming a pattern by using the photoresist composition of the present invention.
Figure 3B:
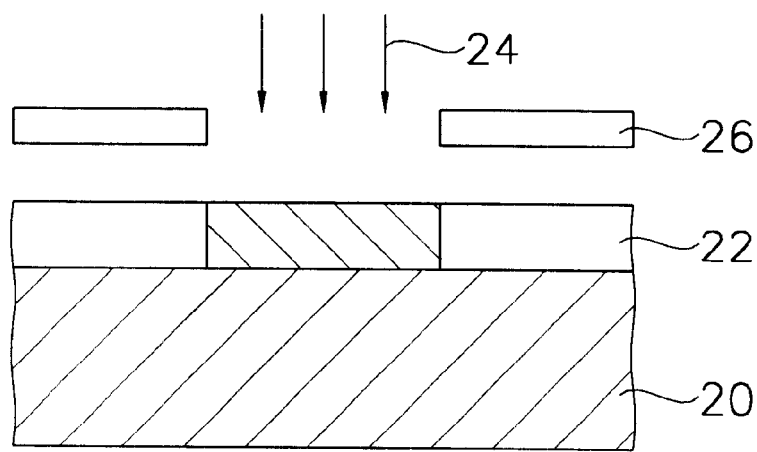
Figure 3C:
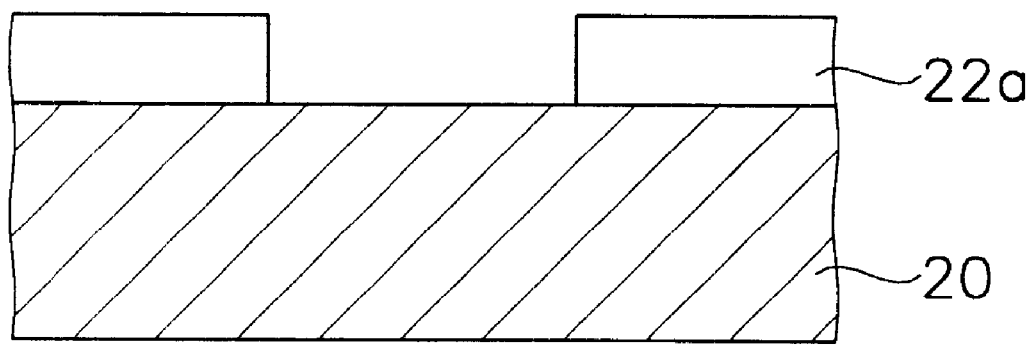

FIGS. 3A–3C are schematic cross-sectional views illustrating a method of forming a pattern by using the photoresist composition of the present invention.

Referring to FIG. 3A, the photoresist composition of the present invention is coated on a surface of a substrate 20 by means of a spraying method, a roller coater method, or a rotating method. After that, the solvent contained in the composition is removed by performing a pre-bake process to form a coating layer 22 The pre-bake process is performed at about 70° C. to about 110° C. for about 1 minute to about 15 minutes. This heat treatment is carried out to evaporate the solvent without decomposing solid contents contained in the photoresist composition. Generally, it is preferred that the concentration of the solvent is minimized through the pre-bake process. Accordingly, the heat treatment is continued until most of the solvent is evaporated.

Referring to FIG. 3B, the substrate 20 on which the photoresist layer 22 is formed is selectively exposed to light 24 such as visible light, ultraviolet, far-infrared, electronic ray, and X-ray by means of an appropriate mask or plate 26 The exposed portion to the light changes into a soluble resin with respect to a developing solution during performing a subsequent developing process.

Referring to FIG. 3C, the exposed substrate 20 is dipped into an alkaline developing solution and stood still to dissolve the whole or almost all the exposed portion of the photoresist layer to the light. As for an appropriate developing solution, an aqueous solution including alkaline hydroxide, ammonium hydroxide, or tetramethyl ammonium hydroxide, is used. After removing unnecessary portion by using the developing solution, a predetermined pattern is obtained.

After completing the developing process, the substrate is rinsed using ultra pure water for about 30 seconds to about 90 seconds to remove impurities and then is dried to form a pattern. Then, the formed pattern is heated to about 100° C. to about 250° C. by means of a heating apparatus such as a hot plate or an oven to completely cure the pattern to obtain a desired organic insulating layer pattern 22a.

Thereafter, a reflecting layer is formed on the organic insulating layer pattern 22a by performing appropriate processes according to a common method in the art.

The preferred embodiments of the present invention for synthesis of an alkali-soluble acryl copolymer and preparation of a positive-type photoresist composition will be described in detail below by using Examples.

SYNTHETIC EXAMPLE 1

Synthesis of an Alkali-soluble Acryl Copolymer 7 parts by weight of 2,2'-azobis(2,4-dimethyl barellonitrile), 200 parts by weight of propyleneglycol monomethyl ether acetate, 15 parts by weight of methacrylic acid, 30 parts by weight of glycidyl methacrylate, 20 parts by weight of styrene, 5 parts by weight of 2-hydroxyethyl acrylate, and 30 parts by weight of benzyl methacrylate as reactants were added Into a flask having a cooling tube and a stirrer. Then, air in the flask was replaced with nitrogen and the reactants were stirred. The reactants were heated to about 62° C. and kept for about 5 hours to prepare an alkali-soluble acryl copolymer including copolymers. A weight average molecular weight (Mw) of the prepared copolymer was 12,800 which was measured by Gel Permeation Chromatography (GPC).

SYNTHETIC EXAMPLE 2

Synthesis of an Alkali-soluble Acryl Copolymer 7 parts by weight of 2,2'-azobis(2,4-dimethyl barellonitrile), 200 parts by weight of tetrahydrofurane, 15 parts by weight of itaconic acid, 25 parts by weight of glycidyl methacrylate, 20 parts by weight of styrene, 5 parts by weight of 2-hydroxyethyl acrylate, and 30 parts by weight of benzyl methacrylate as reactants were added into a flask provided having a cooling tube and a stirrer. Then, air in the flask was replaced with nitrogen and the reactants were slowly stirred. The reactants were heated to about 62° C. and kept for about 8 hours to prepare an alkali-soluble acryl copolymer including copolymers. Mw of the prepared copolymer was 9,400 which was measured by GPC.

EXAMPLE 1

Preparation of a Positive-type Photoresist Composition

Polymer solution prepared by Synthetic Example 1 (corresponding to 100 parts by weight of solid content), 25 parts by weight of 4,4'-[1-[4-[1-[4-hydroxyphenyl]-1-methylethyl]phenyl]ethylidene]bisphenol 1,2-naphthoquinonediazide 5-sulfonic acid ester (a condensate of 1 mol of 4,4'-[1-[4-[1-[4-hydroxyphenyl]-1-methylethyl]phenyl]ethylidene]bisphenol with 2 mol of 1,2-quinonediazide 5-sulfonic acid ester) as an 1,2-quinonediazide compound, 10 parts by weight of melamine resin, hexamethylol melamine hexamethyl ether as a nitrogen-containing corss-linker and 5 parts by weight of cyclohexane toluene sulfonic ester (represented by chemical structure of (1)) as a thermal acid generator were mixed. The mixture was dissolved into propyleneglycol monomethyl ether acetate so that the solid content of the obtained solution was 35% by weight. The solution was filtered by means of a Millipore filter to obtain a positive-type photoresist composition.

The photoresist composition was coated on a glass substrate by using a spin coater and then pre-baked at about 90° C. for about 2 minutes by using a hot plate to form a coating layer. Next, The formed layer was exposed to ultraviolet having 365 nm wave length with an intensity of 15 mW/cm² for about 20 seconds by using a predetermined mask. After the exposing process, the layer was developed by using an aqueous solution of 0.4% by weight of tetramethyl ammonium hydroxide at about 25° C. for about 1 minute and then was rinsed by using ultra pure water for about 1 minute to form an organic insulating layer pattern.

EXAMPLE 2

Preparation of a Positive-type Photoresist Composition

A photoresist composition was prepared according to the method described in Example 1 except that the polymer solution including the polymer prepared by Synthetic Example 2 was used instead of the polymer solution including the polymer prepared by Synthetic Example 1.

After preparing the photoresist composition, an organic insulating layer pattern was formed by the same method as described in Example 1.

EXAMPLE 3

Preparation of a Positive-type Photoresist Composition

A photoresist composition was prepared according to the method described in Example 1 except that 5 parts by weight of cyclohexane propyl sulfonic ester was used instead of cyclohexane toluene sulfonic ester as the thermal acid generator.

After preparing the photoresist composition, an organic insulating layer pattern was formed by the same method-as described in Example 1.

EXAMPLE 4

Preparation of a Positive-type Photoresist Composition

A photoresist composition was prepared according to the method described in Example 1 except that 10 parts by weight of cyclohexane toluene sulfonic ester was used instead of 5 parts by weight of this compound as the thermal acid generator.

After preparing the photoresist composition, an organic insulating layer pattern was formed by the same method described in Example 1.

COMPARATIVE EXAMPLE 1

Preparation of a Positive-type Photoresist Composition

A photoresist composition was prepared according to the method described in Example 1 except that the thermal acid generator was not added.

After preparing the photoresist composition, an organic insulating layer pattern was formed by the same method as described in Example 1.

COMPARATIVE EXAMPLE 2

Preparation of a Positive-type Photoresist Composition

A photoresist composition was prepared according to the method described in Example 2 except that the thermal acid generator was not added.

After preparing the photoresist composition, an organic insulating layer pattern was formed by the same method as described in Example 1.

Table 1 is the results of the characteristics of the photoresist compositions prepared by the Examples 1 to 3 and Comparative Examples 1 and 2The estimation on each characteristic was performed as follows.

The resolution was estimated by a minimum sized unit of the formed pattern. The residual layer rate was estimated by the change of the pattern thicknesses before and after the development. The heat-resistance was estimated after heating the substrate on a heating plate at about 110° C. for about 3 minutes and the pattern flowing degree was estimated before and after the heating. At this time, a symbol ○ represents when the changing rate of the pattern size due to the thermal flow was 5% or less, a symbol Δ represents when 5–10%, and a symbol x represents when 10% or over.

TABLE 1

|  | Sensitivity (mJ/cm²) | Resolution (μm) | Residual layer rate (%) | Heat-resistance |
|---|---|---|---|---|
| Ex. 1 | 200 | 3 | 93 | ○ |
| Ex. 2 | 170 | 3 | 92 | ○ |
| Ex. 3 | 200 | 3 | 94 | ○ |
| Ex. 4 | 240 | 3 | 95 | ○ |
| Com. Ex. 1 | 190 | 3 | 90 | X |
| Com. Ex. 2 | 150 | 5 | 84 | Δ |

Referring to Table 1, it can be noted that the organic layers formed by using the photoresist compositions including the thermal acid generator and prepared by Examples 1–4 according to the present invention exhibit good residual layer rate and heat-resistance. In contrast, the organic layers formed by using the photoresist compositions prepared by Comparative Examples 1 and 2 exhibit low residual layer rate and heat-resistance.

Figure 1B:
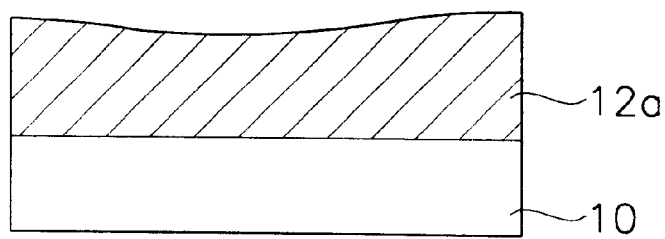
Figure 4A:
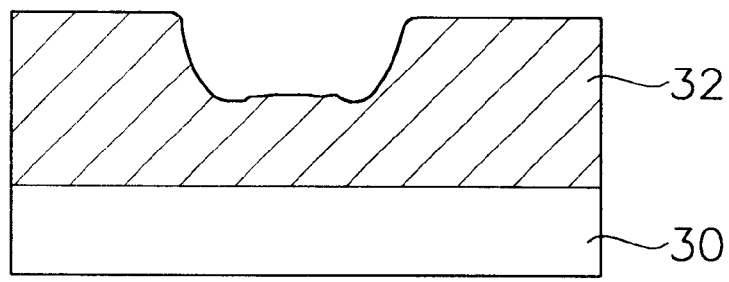
FIGS. 4A and 4B are cross-sectional views for the patterns obtained after development (FIG. 4A) and after thermal curing (FIG. 4B) when an embossing pattern is formed by using the photoresist composition of the present invention.
Figure 4B:
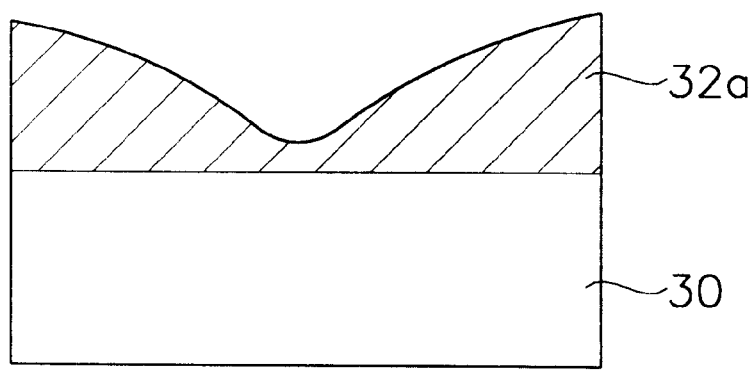

FIGS. 4A and 4B are cross-sectional views illustrating the patterns obtained after development (FIG. 4A) and after thermal curing (FIG. 4B) when forming an embossing pattern by using the photoresist composition of the present invention. A pattern after development 32 and a pattern after curing 32a are formed on a substrate 30. The curing was implemented at about 110° C. for about 2 minutes and at about 220° C. for about 30 minutes. The photoresist pattern 32a of the present invention after curing is improved to have good irregularities as compared with FIGS. 1A and 1B, because the thermal flow of the pattern formed by using the photoresist composition of the present invention is prevented from keeping a good irregularities after curing.

As described above, the photoresist composition of the present invention was prepared by adding a thermal acid generator and when forming a thermally curing pattern, a thermal flow can be prevented. After the development, a heat treatment is performed and the combination degree of polymer is increased during the heat. treatment. This promotes the curing reaction to prevent the pattern reflow by the heat. Accordingly, an organic insulating layer which. has appropriate irregularities can be advantageously formed by using the photoresist composition of the present invention.

While the present invention is described in detail referring to the attached embodiments, various modifications, alternate constructions and equivalents may be employed without departing from the true spirit and scope of the present invention.

What is claimed is:

1. A photoresist composition comprising about 100 parts by weight of an alkali-soluble acryl copolymer, about 5–100 parts by weight of 1,2-quinonediazide compound, about 2–35 parts by weight of nitrogen-containing cross-linker, and about 0.1–10 parts by weight of a thermal acid generator which produces an acid by heat.

2. A photoresist composition as claimed in claim 1, wherein said alkali-soluble acryl copolymer has a weight-average molecular weight (Mw) in a range of about $5\times10^3$–$3\times10^4$ as converted to polystyrene.

3. A photoresist composition as claimed in claim 1, wherein said alkali-soluble acryl copolymer is prepared by copolymerizing about 5–40% by weight of unsaturated carbonic acid, unsaturated carbonic acid anhydride or a mixture thereof, about 10–70% by weight of an epoxy-functional group containing unsaturated compound, and about 10–70% by weight of unsaturated olefin compound in a solvent having an polymerization initiator.

4. A photoresist composition as claimed in claim 3, wherein said unsaturated carbonic acid is selected from the group consisting of acrylic acid, methacrylic acid, maleic acid anhydride, and their mixtures.

5. A photoresist composition as claimed in claim 3, wherein said epoxy-functional group containing unsaturated compound is selected from the group consisting of glycidyl acrylate, glycidyl methacrylate, α-ethylglycidyl acrylate, α-n-propylglycidyl acrylate, α-n-butyiglycidyl acrylate, acrylic acid-β-methyl glycidyl, methacrylic acid-β-methyl glycidyl, acrylic acid-β-ethyl glycidyl, methacrylic acid-β-ethyl glycidyl, acrylic acid-3,4-epoxybutyl, methacrylic acid-3,4-epoxybutyl, acrylic acid-6,7-epoxy heptyl, methacrylic acid-6,7-epoxy heptyl, α-ethyl acrylic acid-6,7-epoxy heptyl, O-vinylbenzyl glycidyl ether, m-vinylbenzylglycidyl ether, p-vinylbenzyl glycidyl ether, and their mixtures.

6. A photoresist composition as claimed in claim 3, wherein said unsaturated olefin compound is selected from the group consisting of benzyl methacrylate, methyl methacrylate, ethyl methacrylate, n-butyl methacrylate, sec-butyl methacrylate, t-butyl methacrylate, methyl acrylate, isopropyl acrylate, cyclohexyl methacrylate, 2-methyl cyclohexyl methacrylate, dicyclopentanyl oxyethyl methacrylate, isobornyl methacrylate, cyclohexyl acrylate, 2-methyl cyclohexyl acrylate, dicyclopentanyl oxyethyl acrylate, isovornyl acrylate, phenyl methacrylate, phenyl acrylate, benzyl acrylate, 2-hydroxyethyl methacrylate, styrene, α-methyl styrene, m-methyl styrene, p-methyl styrene, vinyl toluene, p-methoxy styrene, 1,3-butadiene, isoprene, 2,3-dimethyl 1,3-budadiene, and their mixtures.

7. A photoresist composition as claimed in claim 1, wherein said 1,2-quinonediazide compound is prepared by reacting a naphthoquinonediazide sulfonic acid halogen compound with a phenol compound under a presence of a base.

8. A photoresist composition as claimed in claim 7, wherein said phenol compound is selected from the group consisting of 2,3,4-trihydroxy benzophenone, 2,4,6-trihydroxy benzophenone, 2,2',4,4'-tetrahydroxy benzophenone, 2,3,4,3'-tetrahydroxy benzophenone, 2,3,4,4'-tetrahydroxy benzophenone, 2,3,4,2'-tetrahydroxy 4'-methyl benzophenone, 2,3,4,4'-tetrahydroxy 3'-methoxy benzophenone, 2,3,4,2'6'-pentahydroxy benzophenone, 2,4,6,3',4', 5'-hexahydroxy benzophenone, 3,4,5,3',4',5'-hexahydroxy benzophenone, bis(2,4-dihydroxyphenyl) methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl 4-hydroxyphenyl)-3-phenyl propane, 4,4'-[1-[4-[1-[4-hydroxyphenyl]-1-methylethyl]phenyl]ethylidene]bisphenol, bis(2,5-dimethyl 4-hydroxyphenyl)-2-hydroxyphenylmethane, and their mixtures.

9. A photoresist composition as claimed in claim 7, wherein an esterification degree of said reaction between said naphthoquinonediazide sulfonic acid halogen compound and said phenol compound is in a range of about 50–85%.

10. A photoresist composition as claimed in claim 1, wherein said 1,2-quinonediazide compound is at least one selected from the group consisting of 1,2-quinonediazide 4-sulfonic acid ester, 1,2-quinonediazide 5-sulfonic acid ester, and 1,2-quinonediazide 6-sulfonic acid ester.

11. A photoresist composition as claimed in claim 1, wherein said nitrogen-containing cross-linking agent is at least one selected from the group consisting of methylol urea alkyl ether prepared by reacting a condensing product of urea and formaldehyde with alcohol, and methylol melamine alkyl ethers prepared by reacting a condensing product of melamine and formaldehyde with alcohol.

12. A photoresist composition as claimed in claim 11, wherein said methylol urea alkyl ethers includes mono methyl urea methyl ether and dimethyl urea methyl ether, and said methylol melamine alkyl ethers includes hexamethylol melamine hexamethyl ether and hexamethylol melamine hexabutyl ether.

13. A photoresist composition as claimed in claim 1, wherein said thermal acid generator includes a sulfonic ester compound.

14. A photoresist composition as claimed in claim 13, wherein said sulfonic ester compound is represented the following structure:

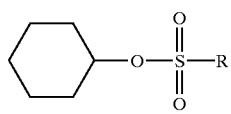

wherein R represents alkyl group.

15. A photoresist composition as claimed in claim 14, wherein said sulfonic ester compound includes cyclohexane toluene sulfonic ester having a structure (1), cyclohexane propyl sulfonic ester having a structure (2), cyclohexane methyl sulfonic ester having a structure (3), cyclohexane octyl sulfonic ester having a structure (4), and cyclohexane camphor sulfonic ester having a structure (5)

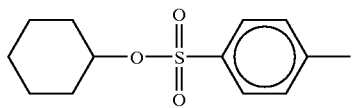

(1)

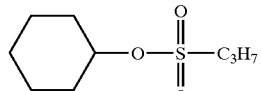

(2)

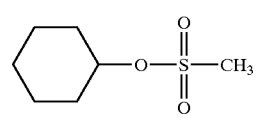

(3)

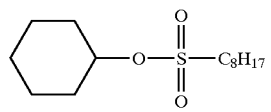

(4)

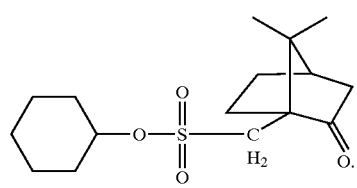

(5)

16. A photoresist composition as claimed in claim 13, further comprising about 50 parts by weight or less of a synthesizable compound having an unsaturated double bond based on 100 parts by weight of said alkali-soluble acryl copolymer, about 2 parts by weight or less of a surfactant based on 100 parts by weight of a solid content of said photoresist composition, and an adhesive.

17. A photoresist composition as claimed in claim 1, wherein a solid concentration of said photoresist composition is in a range of about 30–70%.

18. A method of forming a pattern comprising:

coating a photoresist composition on a substrate and drying to form a photoresist layer;

exposing said photoresist layer by using a mask having a predetermined shape;

developing the exposed photoresist layer by using an aqueous alkaline solution to form a photoresist pattern; and heating the photoresist pattern to cure thereof, wherein the photoresist composition comprises about 100 parts by weight of an alkali-soluble acryl copolymer, about 5–100 parts by weight of 1,2-quinonediazide compound, about 2–35 parts by weight of nitrogen-containing cross-linker and about 0.1–10 parts by weight of a thermal acid generator which produces an acid by heat.

19. A method forming a pattern as claimed in claim 18, wherein said heating is performed at a temperature range of about 100° C. to about 250° C.

20. A method of forming a pattern as claimed in claim 18, wherein said photoresist pattern is an embossing pattern of a liquid crystal display device.

* * * * *